May 28, 1957 T. P. DILLON ET AL 2,794,119

FREQUENCY CONVERTER

Filed Sept. 30, 1953

INVENTORS
THOMAS P. DILLON
& CRAIG L. WHITMAN

BY H. W. Newton

ATTORNEY

United States Patent Office 2,794,119

Patented May 28, 1957

2,794,119

FREQUENCY CONVERTER

Thomas P. Dillon, Yeadon, Pa., and Craig L. Whitman, Moorestown, N. J., assignors, by mesne assignments, to the United States of America as represented by the Secretary of the Army Application September 30, 1953, Serial No. 383,193

1 Claim. (Cl. 250—20)

Figure 1:
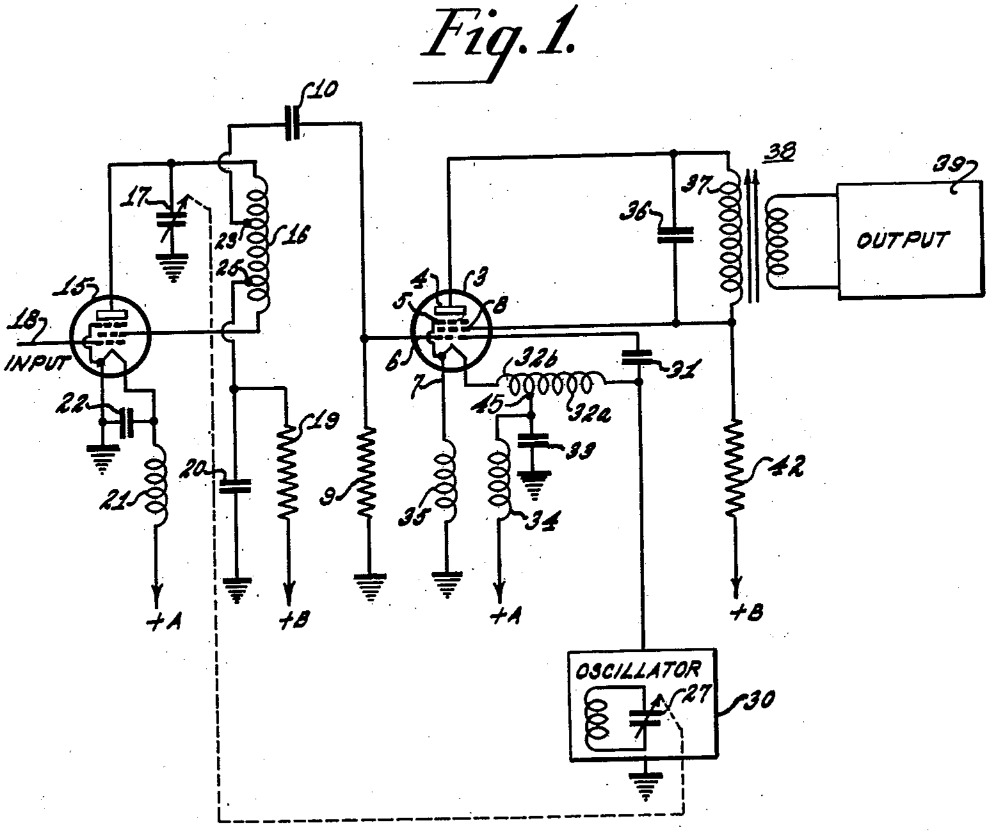

The present invention relates generally to frequency converter circuits such as are commonly used in superheterodyne radio receivers to convert the frequency of received oscillations to oscillations having a common or intermediate frequency. More particularly, the present invention relates to electron tube signal mixers of the type in which a source of locally generated oscillations are coupled with the cathode circuit of the tube.

A converter or mixer of this type, when used in a superheterodyne radio receiver generally has a source of signal modulated radio frequency oscillations applied to a signal input circuit which is connected with the control electrode of the mixer tube and, as described above, the locally generated oscillations are injected into the cathode circuit. The interelectrodal capacitance existing between the various electrodes of the tube, principally the grid-cathode capacitance, couples the oscillator voltage which is injected in the cathode circuit of the mixer to the signal input circuit, causing loading of the input circuit. This loading limits the intensity of the incoming signal which may be delivered to the mixer input circuit without overloading the tube. Furthermore, since the oscillator injection circuit is generally reactive, the amount of the input circuit loading is dependent on the oscillator frequency and hence, varies with the tuning of the receiver.

Accordingly, it is an object of this invention to provide an improved signal mixing circuit for use with superheterodyne receiving systems which has high efficiency and permits greater signal voltage gain in the radio frequency amplification stages than heretofore realized.

A further object of this invention is to provide an improved electron tube mixing circuit for superheterodyne receivers having substantially no loading of the signal input circuit due to the oscillation circuits.

Another object of this invention is to provide means in a signal mixing circuit for effecting high efficiency signal mixing with a minimum of undesired interaction between the signal circuits.

In accordance with the present invention the grid-cathode capacitance of the mixer tube is utilized as part of a bridge network. The other elements of the bridge network comprise a pair of serially connected radio frequency coils having their junction at reference potential, and a small capacitor. The values of the various bridge elements are adjusted so that the control electrode and the junction of the radio frequency coils are equipotential points. Put in other words, the small capacitor feeds an out-of-phase voltage to the control electrode of the mixer tube to reduce or cancel the capacity loading effect due to the oscillator circuit. Such a reduction or cancellation of the loading effect permits increased gain in the amplification stages ahead of the mixer, that is, permits a signal of higher intensity to be delivered to the mixer.

A further object of this invention is to provide means for injecting a signal into the cathode circuit of an electron tube mixer or converter without causing loading of the input circuit thereof.

Figure 2:
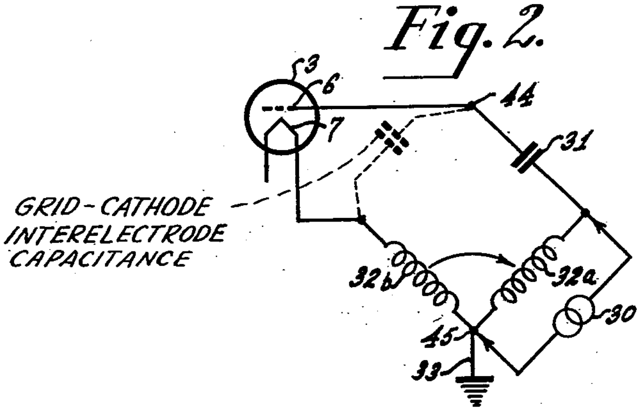

The novel features of this invention are set forth with particularity in the appended claim. The invention itself, however, both as to its organization and method of operation, together with further objects and advantages thereof, may be best understood by reference to the following description when taken in connection with the accompanying drawings, in which:

Figure 1 is a schematic circuit diagram of a signal mixing circuit constructed in accordance with the invention; and Figure 2 is an equivalent schematic circuit diagram of the bridge network of which the inherent grid-cathode inter-electrode capacitance is shown as an actual part and which effectively reduces the loading effect of the local oscillator signal on the signal input circuit of the mixer tube.

Referring to Figure 1 of the drawing, an electron discharge device 3 which may be a type 5678 tube is connected to serve as a frequency converter, or first detector, in a superheterodyne radio receiver. This discharge device comprises an anode 4, a suppressor grid 5, a screen grid 8, a control electrode 6, and a cathode or filament 7. The control electrode 6 is connected to a point of fixed reference potential or ground through a grid leak resistor 9; however, if desired, the control electrode 6 may be connected through the grid leak resistor 9 to a unidirectional bias voltage source which varies with the intensity of the received signal for automatic volume control purposes.

The input circuit of the discharge device 3 is connected through a coupling capacitor 10 to an earlier stage of radio frequency amplification, however, it is recognized that the input circuit of the discharge device 3 may be connected to other sources of radio frequency waves such as an antenna.

The earlier stage of radio frequency amplification includes an electron discharge amplifier tube 15. The input signal which may be from another stage of radio frequency amplification or directly from an antenna is connected with the control grid of the tube 15. The received signals are amplified by the electron discharge device 15 and conveyed to a signal selection circuit comprising the inductor 16 and the variable capacitor 17 which is tunably resonant at the frequency of the received signals. A source of polarizing potential +B is connected through a D.-C. dropping resistor 19 and the aforementioned circuit to the anode of the tube 15. The inductance portion 16 of the signal selection circuit is provided with a pair of taps 23 and 25. The signal output from the resonant circuit is taken from the tap 23 and is connected through the coupling capacitor 10 to the control electrode 6 of the mixer tube. The screen grid of the electron discharge device 15 is connected through a portion of the inductance 16 and the resistor 19 to the source of polarizing potential +B. A radio frequency bypass capacitor 20 is connected between ground and the terminal 25, to provide a low impedance path to ground for radio frequency signals.

The radio frequency amplifier tube 15 has a filamentary cathode. One side of the filament is connected with ground and the other side is connected through a radio frequency choke coil 21 to a source of filamentary energizing potential +A. A capacitor 22 is connected across the terminals of the filament to insure that both terminals of the filament are effectively connected at high frequency ground potential.

The signal mixer tube 3 has a filamentary cathode 7 one side of which is connected to ground through a radio frequency choke 35 which provides a high impedance to signals of the oscillator frequency The other terminal of the filament 7 is connected through the inductor **32*b* and a second radio frequency choke coil 34** to a source of filament voltage +A.

The anode circuit of the frequency converter comprises a parallel resonant circuit including an inductor 37 and a capacitor 36. This resonant circuit is tuned to an intermediate frequency resulting from the heterodyning of the radio frequency and oscillator signals. A source of operating supply voltage +B for the converter tube 3 is connected through a D.-C. dropping resistor 42 and the intermediate frequency resonant circuit to the anode 4. The screen grid 8 of the frequency converter tube 3 is directly connected with the supply voltage source +B through the resistor 42.

The inductor 37 of the intermediate frequency resonant circuit comprises the primary winding of an intermediate frequency transformer. The secondary winding of the transformer 38 may be connected with a utilization circuit such as an intermediate frequency amplifier or the like.

Referring particularly to Figures 1 and 2 a source of oscillatory energy 30 which may be, for instance, an oscillator of any well known construction, is connected with a mixer tube 3. The oscillator 30 is tunable over a predetermined frequency range in unison with the tuning of the radio frequency signal selection circuits such as hereinbefore described, to tune the receiver for response to a desired station. The frequency varying element of the oscillator circuit is a variable capacitor 29 which is ganged with the variable capacitor 17 in the radio frequency amplifier stage for simultaneous movement and tuning.

One terminal of the oscillator 30 is connected with a point of fixed reference potential or ground and the other terminal is connected with one end of an inductor **32*a*. A capacitor 33 which has a very low impedance to signals of oscillator frequency, is connected from the other side of the inductor 32*a* to ground to provide a current return path for the oscillator currents. In Figure 2 the capacitance 33** is shown as a direct shorting connection to ground.

The oscillator currents flowing through the inductor **32*a* develop a potential across that inductor which is coupled to an inductor 32*b*. The inductor 32*b* is connected from the junction of the capacitor 33 and the inductor 32*a* to one side of the filament 7. In practice, it has been found desirable to combine the inductors 32*a* and 32*b* into a single coil with a tapping terminal at an appropriate location. A coil consisting of 25 turns closely wound on a .125″ diameter powdered iron core and tapped at the sixth turn was successfully used and tested in a circuit embodying the invention. The oscillator potentials coupled to the inductor 32*b* which is connected in the filament circuit of the mixer tube are heterodyned in the mixer tube 3 with the radio frequency signals provided with the signal grid 6** to produce a resultant intermediate signal output.

In operation the inherent grid-to-cathode capacitance of the mixer tube 3 couples a portion of the oscillator potential from the cathode 7 to the signal grid 6. These oscillator potentials appearing on the signal grid are often referred to as "stray" oscillation potentials. This condition causes loading of the mixer input circuit, and reduces the amount of radio frequency signal which may be applied to the mixer, or in other words, would limit the amount of permissible gain in the radio frequency stages ahead of the mixer. Furthermore, since the filament circuit is reactive the impedance thereof varies as the oscillator frequency is changed. This impedance change without further compensation is reflected into the mixer input circuit causing variable loading as the frequency of the receiver is changed.

A capacitor 31 is connected from the high potential side of the oscillation generator to the signal grid 6 of the mixer. This capacitance forms one portion of a bridge network including the grid-cathode interelectrode capacitance of the mixer tube and the inductors **32*a* and 32*b*. The inductance and capacitance values of the bridge elements are such that a pair of terminals 44 and 45 as shown in Figure 2 are equipotential points. That is, there is no oscillator voltage appearing between the signal grid 6** and ground due to the inherent grid-cathode capacitance.

In effect the capacitor 31 may be considered to feed an oscillator voltage to the grid 6 which is equal in magnitude and opposite in phase to the oscillator voltage conveyed to the grid 6 by the interelectrodal capacitance.

The net result of the bridge network is a reduction of the signal input circuit loading which allows increased signal gain in the radio frequency stages prior to the signal mixer 3. Furthermore, the bridge circuit shown and described hereinbefore will balance out any oscillator voltage coupled to the grid 6 through the interelectrodal capacitance of the mixer tube over the tuning range of the oscillator.

By merit of the bridge circuit provided in combination with the signal mixer described hereinbefore it is possible to achieve higher gain than heretofore realized in mixers using cathode injection of the oscillator signal, and maintain a minimum of undesirable interaction between the oscillator and signal circuits.

What is claimed is:

In a superheterodyne receiving system adapted to receive selected radio frequency signals, the combination with means for intercepting the radio frequency signals of a frequency conversion circuit including an electron tube having at least an anode, a filamentary type cathode and a control electrode, means applying said intercepted radio frequency signals to said control electrode, a source of heterodyning oscillator signals having a predetermined frequency with respect to the frequency of said radio frequency signals, means providing a high impedance to said oscillator and said radio frequency signals connected between said filament and a point of reference potential, an inductor having a tap thereon connected between said source of heterodyning oscillator signals and said filamentary cathode for inductively coupling said source of oscillator signals with said cathode, a capacitor having low reactance to said oscillator signals connected between said tap and said point of reference potential, a second capacitance connected between said control electrode and said source of oscillations, the portions of said inductor and said second capacitor providing inductance and capacitance values in said system to balance oscillation voltages applied to said input circuit through inherent interelectrodal capacitance, an output circuit connected with said anode, and means in said output circuit for deriving an intermediate frequency output signal.

References Cited in the file of this patent

UNITED STATES PATENTS

| | | |
|---|---|---|
| 1,809,809 | Kellogg | Aug. 25, 1931 |
| 2,594,167 | Herold | Apr. 22, 1952 |

FOREIGN PATENTS

| | | |
|---|---|---|
| 413,724 | Great Britain | July 16, 1934 |